(12) United States Patent
Argyres

(10) Patent No.: US 8,773,880 B2
(45) Date of Patent: Jul. 8, 2014

(54) CONTENT ADDRESSABLE MEMORY ARRAY HAVING VIRTUAL GROUND NODES

(75) Inventor: Dimitri Argyres, San Jose, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 64 days.

(21) Appl. No.: 13/167,646

(22) Filed: Jun. 23, 2011

(65) Prior Publication Data
US 2012/0327696 A1  Dec. 27, 2012

(51) Int. Cl.
*G11C 15/00* (2006.01)

(52) U.S. Cl.
USPC ............... 365/49.17; 365/49.1; 365/49.16

(58) Field of Classification Search
USPC ............................ 365/49.1, 49.16, 49.17
See application file for complete search history.

(56) References Cited

U.S. PATENT DOCUMENTS

| | | |
|---|---|---|
| 3,665,422 A | 5/1972 | McCoy et al. |
| 4,112,502 A | 9/1978 | Scheuneman |
| 4,747,080 A | 5/1988 | Yamada |
| 4,779,226 A | 10/1988 | Haraszti |
| 4,791,606 A | 12/1988 | Threewitt et al. |
| 4,831,585 A | 5/1989 | Wade et al. |
| 4,903,268 A | 2/1990 | Hidaka et al. |
| 4,958,352 A | 9/1990 | Noguchi et al. |
| 4,991,136 A | 2/1991 | Mihara |
| 5,046,046 A | 9/1991 | Sweha et al. |
| 5,073,727 A | 12/1991 | Shizu |
| 5,127,014 A | 6/1992 | Raynham |
| 5,184,325 A | 2/1993 | Lipovski |
| 5,233,614 A | 8/1993 | Singh |
| 5,311,462 A | 5/1994 | Wells |
| 5,319,589 A | 6/1994 | Yamagata et al. |
| 5,319,590 A | 6/1994 | Montoye |
| 5,450,424 A | 9/1995 | Okugaki et al. |
| 5,452,243 A | 9/1995 | Ansel et al. |
| 5,455,834 A | 10/1995 | Chang et al. |
| 5,469,450 A | 11/1995 | Cho et al. |
| 5,491,703 A | 2/1996 | Barnaby et al. |
| 5,561,429 A | 10/1996 | Halberstam et al. |
| 5,568,415 A | 10/1996 | McLellan et al. |
| 5,570,377 A | 10/1996 | Gonzalez et al. |
| 5,572,460 A | 11/1996 | Lien |
| 5,598,115 A | 1/1997 | Holst |
| 5,604,753 A | 2/1997 | Bauer et al. |
| 5,629,950 A | 5/1997 | Godiwala et al. |

(Continued)

OTHER PUBLICATIONS

International Search Report and Written Opinion for International Application No. PCT/US12/42704, Commissioner for Patents, United States, mailed on Sep. 12, 2012.

(Continued)

*Primary Examiner* — Fernando Hidalgo
(74) *Attorney, Agent, or Firm* — Sterne, Kessler, Goldstein & Fox P.L.L.C.

(57) ABSTRACT

Power consumption of CAM devices is reduced during compare operations between a search key and data stored in the device's array by reducing the amount of electric charge by which the match line is discharged during mismatch conditions. More specifically, for some embodiments, each row of the CAM array includes circuitry that discharges the match line to a virtual ground node rather than to ground potential during mismatch conditions. Because the electrical potential on the virtual ground node is greater than ground potential, power consumption associated with charging the match line back to a logic high state during the next compare operation is reduced.

18 Claims, 8 Drawing Sheets

(56) References Cited

U.S. PATENT DOCUMENTS

| | | | |
|---|---|---|---|
| 5,642,320 A | 6/1997 | Jang | |
| 5,644,583 A | 7/1997 | Garcia et al. | |
| 5,682,394 A | 10/1997 | Blake et al. | |
| 5,699,369 A | 12/1997 | Guha | |
| 5,724,296 A | 3/1998 | Jang | |
| 5,727,003 A | 3/1998 | Zook | |
| 5,761,222 A | 6/1998 | Baldi | |
| 5,796,671 A | 8/1998 | Wahlstrom | |
| 5,796,758 A | 8/1998 | Levitan | |
| 5,872,802 A | 2/1999 | Knaack et al. | |
| 5,890,201 A | 3/1999 | McLellan et al. | |
| 6,009,548 A | 12/1999 | Chen et al. | |
| 6,032,214 A | 2/2000 | Farmwald et al. | |
| 6,058,500 A | 5/2000 | DesJardins et al. | |
| 6,067,656 A | 5/2000 | Rusu et al. | |
| 6,125,049 A | 9/2000 | Nataraj | |
| 6,128,207 A | 10/2000 | Lien et al. | |
| 6,134,631 A | 10/2000 | Jennings, III | |
| 6,137,707 A | 10/2000 | Srinivasan et al. | |
| 6,151,247 A | 11/2000 | Estakhri et al. | |
| 6,154,384 A | 11/2000 | Nataraj et al. | |
| 6,166,939 A | 12/2000 | Nataraj et al. | |
| 6,188,629 B1 | 2/2001 | Kaplinsky | |
| 6,191,969 B1 | 2/2001 | Pereira | |
| 6,199,140 B1 | 3/2001 | Srinivasan et al. | |
| 6,216,246 B1 | 4/2001 | Shau | |
| 6,219,815 B1 | 4/2001 | DesJardins et al. | |
| 6,233,717 B1 | 5/2001 | Choi | |
| 6,243,280 B1 | 6/2001 | Wong et al. | |
| 6,243,281 B1 | 6/2001 | Pereira | |
| 6,262,907 B1 | 7/2001 | Lien et al. | |
| 6,289,471 B1 | 9/2001 | Gordon | |
| 6,324,087 B1 | 11/2001 | Pereira | |
| 6,362,990 B1 | 3/2002 | Gibson et al. | |
| 6,362,993 B1 | 3/2002 | Henderson et al. | |
| 6,374,325 B1 | 4/2002 | Simpson et al. | |
| 6,381,191 B2 | 4/2002 | Ooiishi | |
| 6,385,070 B1 | 5/2002 | Peterson | |
| 6,397,290 B1 | 5/2002 | Williams et al. | |
| 6,400,593 B1 | 6/2002 | Lien et al. | |
| 6,408,417 B1 | 6/2002 | Moudgal et al. | |
| 6,418,042 B1 | 7/2002 | Srinivasan et al. | |
| 6,421,265 B1 | 7/2002 | Lien et al. | |
| 6,430,073 B1 | 8/2002 | Batson et al. | |
| 6,430,074 B1 | 8/2002 | Srinivasan | |
| 6,434,033 B1 | 8/2002 | Chien | |
| 6,460,112 B1 | 10/2002 | Srinivasan et al. | |
| 6,470,418 B1 | 10/2002 | Lien et al. | |
| 6,477,615 B1 | 11/2002 | Tanaka | |
| 6,480,406 B1 | 11/2002 | Jin et al. | |
| 6,496,399 B1 | 12/2002 | Choi et al. | |
| 6,505,270 B1 | 1/2003 | Voelkel et al. | |
| 6,538,911 B1 | 3/2003 | Allan et al. | |
| 6,542,391 B2 | 4/2003 | Pereira et al. | |
| 6,560,156 B2 | 5/2003 | Lien et al. | |
| 6,563,754 B1 | 5/2003 | Lien et al. | |
| 6,564,754 B1 | 5/2003 | Cohen | |
| 6,597,595 B1 | 7/2003 | Ichiriu et al. | |
| 6,618,281 B1 | 9/2003 | Gordon | |
| 6,646,900 B2 | 11/2003 | Tsuda et al. | |
| 6,665,220 B2 | 12/2003 | Vlasenko | |
| 6,690,595 B1 | 2/2004 | Srinivasan et al. | |
| 6,700,810 B1 | 3/2004 | Ichiriu et al. | |
| 6,700,827 B2 | 3/2004 | Lien et al. | |
| 6,707,693 B1 | 3/2004 | Ichiriu | |
| 6,721,202 B1 | 4/2004 | Roge et al. | |
| 6,728,124 B1 | 4/2004 | Ichiriu et al. | |
| 6,741,253 B2 | 5/2004 | Radke et al. | |
| 6,760,241 B1 | 7/2004 | Gharia | |
| 6,760,881 B2 | 7/2004 | Batson et al. | |
| 6,775,168 B1 | 8/2004 | Park et al. | |
| 6,804,133 B1 | 10/2004 | Khanna | |
| 6,807,077 B2 | 10/2004 | Noda et al. | |
| 6,842,360 B1 | 1/2005 | Srinivasan | |
| 6,845,026 B1 | 1/2005 | Gharia | |
| 6,856,527 B1 | 2/2005 | Srinivasan et al. | |
| 6,865,098 B1 | 3/2005 | Ichiriu et al. | |
| 6,867,989 B1 | 3/2005 | Roy | |
| 6,867,990 B2 | 3/2005 | Regev et al. | |
| 6,870,229 B2 | 3/2005 | Dessard et al. | |
| 6,888,731 B2 | 5/2005 | Roth et al. | |
| 6,900,999 B1 | 5/2005 | Yen et al. | |
| 6,967,856 B1 | 11/2005 | Park et al. | |
| 7,009,862 B2 | 3/2006 | Higeta et al. | |
| 7,050,318 B1 | 5/2006 | Argyres | |
| 7,113,415 B1 | 9/2006 | Khanna | |
| 7,133,302 B1 | 11/2006 | Srinivasan et al. | |
| 7,298,635 B1 | 11/2007 | Maheshwari | |
| 7,319,602 B1 | 1/2008 | Srinivasan et al. | |
| 7,345,936 B2 | 3/2008 | Notani | |
| 7,362,602 B1* | 4/2008 | Meng et al. | 365/49.17 |
| 7,433,217 B1 | 10/2008 | Maheshwari | |
| 7,499,303 B2 | 3/2009 | Lien et al. | |
| 7,577,785 B2 | 8/2009 | Yoon et al. | |
| 7,800,930 B1 | 9/2010 | Deshpande et al. | |
| 7,852,652 B1 | 12/2010 | Fabry | |
| 7,920,398 B1 | 4/2011 | Khanna et al. | |
| 7,924,588 B2 | 4/2011 | Arsovski et al. | |
| 7,944,724 B2 | 5/2011 | Chu | |
| 8,462,532 B1 | 6/2013 | Argyres | |
| 8,553,441 B1 | 10/2013 | Argyres | |
| 8,582,338 B1 | 11/2013 | Argyres | |
| 8,625,320 B1 | 1/2014 | Argyres | |
| 2007/0097722 A1 | 5/2007 | Phan et al. | |
| 2007/0247885 A1 | 10/2007 | Watanabe et al. | |
| 2010/0165691 A1* | 7/2010 | Watanabe et al. | 365/49.17 |
| 2012/0206951 A1* | 8/2012 | Rachamadugu et al. | 365/49.17 |

OTHER PUBLICATIONS

Application Note AN-94 "Error Detection and Correction with IDT49C466", released by Integrated Device Technology, Inc., pp. 131-141, (1996).

Fourouzan, B., "Introduction to Telecommunications and Networking." Chapter 8, pp. 194-226, Aug. 1997.

Halsall, F., Data Communications, Computer Networks and OSI, 2d. Ed., pp. 499-508, Addison-Wesley Publ. Co. (1998).

Kalter et al., "A 50-ns 16-Mb DRAM with a 10-ns Data Rate and On-Chip ECC," IEEE Journal of Solid-State Circuits vol. 25, No. 5, pp. 1118-1127, Oct. 1990.

SiberCore Technologies, Soft Error in TCAMS: Causes and Cures, pp. 1-5, Jul. 2003.

*Ex Parte Quayle* Action, dated Nov. 7, 2012, for U.S. Appl. No. 13/015,543, filed Jan. 27, 2011, 6 pages.

Notice of Allowance, dated Jan. 23, 2013, for U.S. Appl. No. 13/015,543, filed Jan. 27, 2011, 7 pages.

Notice of Allowance, dated Feb. 14, 2013, for U.S. Appl. No. 13/015,543, filed Jan. 27, 2011, 8 pages.

Non-Final Action, dated Nov. 23, 2012, for U.S. Appl. No. 13/149,878, filed May 31, 2011, 5 pages.

Notice of Allowance, dated Mar. 7, 2013, for U.S. Appl. No. 13/149,878, filed May 31, 2011, 5 pages.

Notice of Allowance, dated Jul. 9, 2013, for U.S. Appl. No. 13/149,878, filed May 31, 2011, 6 pages.

Notice of Allowance, dated Oct. 10, 2012, for U.S. Appl. No. 13/149,885, filed May 31, 2011, 9 pages.

Notice of Allowance, dated Jan. 29, 2013, for U.S. Appl. No. 13/149,885, filed May 31, 2011, 5 pages.

Notice of Allowance, dated May 24, 2013, for U.S. Appl. No. 13/149,885, filed May 31, 2011, 6 pages.

Non-Final Action, dated Apr. 5, 2013, for U.S. Appl. No. 13/216,104, filed Aug. 23, 2011, 8 pages.

Notice of Allowance, dated Jul. 29, 2013, for U.S. Appl. No. 13/216,104, filed Aug. 23, 2011, 10 pages.

Non-Final Action, dated Jan. 9, 2013, for U.S. Appl. No. 13/167,552, filed Jun. 23, 2011, 15 pages.

Final Action, dated Jan. 27, 2013, for U.S. Appl. No. 13/167,552, filed Jun. 23, 2011, 19 pages.

Non-Final Action, dated Jan. 6, 2014, for U.S. Appl. No. 13/167,552, filed Jun. 23, 2011, 21 pages.

(56) References Cited

OTHER PUBLICATIONS

International Preliminary Report on Patentability for International Application No. PCT/US2012/042704, mailed on Dec. 23, 2013, 9 pages.

U.S. Appl. No. 13/167,552, filed Jun. 23, 2011, entitled "Content Addressable Memory Row Having Virtual Ground and Charge Sharing".

* cited by examiner

US 8,773,880 B2

CONTENT ADDRESSABLE MEMORY ARRAY HAVING VIRTUAL GROUND NODES

TECHNICAL FIELD

The present embodiments generally relate to content addressable memory (CAM) devices, and more particularly to the architecture of rows of CAM cells.

BACKGROUND

Content addressable memory (CAM) devices are frequently used in network switching and routing applications to determine forwarding destinations, to perform classification functions, to implement Quality of Service (QoS) functions, and other tasks associated with routing data packets across a network. More specifically, a CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match condition, and a priority encoder determines the match address or index of the highest priority matching (HPM) entry in the CAM array.

The match lines in a CAM array are typically pre-charged high toward the supply voltage VDD for each and every compare operation. Thus, for each row having a mismatch condition, an associated match line ML is first pre-charged high toward VDD and then discharged toward low ground potential. Current flow associated with this charging and discharging of such match lines results in undesirable power consumption. Further, as the number of CAM cells in each row of a CAM array increases, capacitive loading on the match lines increases accordingly, which further increases power consumption.

Thus, there is a need to reduce the power consumption associated with pre-charging and discharging the match lines of a CAM array during successive compare operations.

BRIEF DESCRIPTION OF THE DRAWINGS

Present embodiments are illustrated by way of example, and not by way of limitation, in the figures of the accompanying drawings and in which like reference numerals refer to similar elements and in which.

DETAILED DESCRIPTION

An apparatus for reducing power consumption in a CAM device is disclosed. In the following description, for purposes of explanation, specific nomenclature is set forth to provide a thorough understanding of the present disclosure. However, it will be apparent to one skilled in the art that these specific details may not be required to practice the present embodiments. In other instances, well-known circuits and devices are shown in block diagram form to avoid obscuring the present embodiments unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather include within their scope all embodiments defined by the appended claims.

Figure 1A:
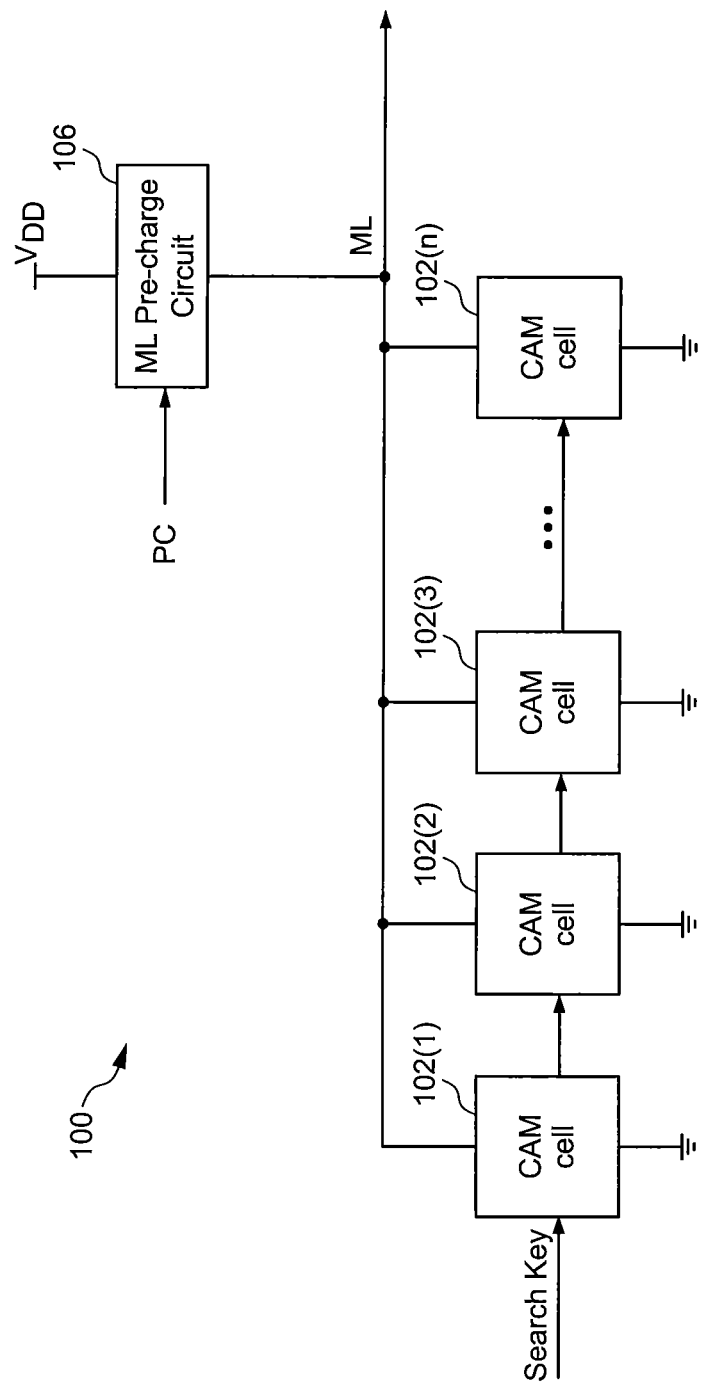
FIG. 1A is a block diagram of a row of CAM cells coupled to a match line.

FIG. 1A shows a CAM row 100 as having n CAM cells 102(1)-102(n) each coupled to an associated match line ML. Each CAM cell 102 is coupled between a match line ML and ground potential. Although not shown for simplicity, each CAM cell 102 includes at least one storage element to store one or more data bits and includes at least one compare circuit that compares a bit of a search key (e.g., a comparand word) with data stored in the storage element. The storage element can be implemented using Static Random Access Memory (SRAM), Dynamic RAM (DRAM), a non-volatile memory cell (e.g., EEPROM or flash memory cell), or any other suitable memory element. For simplicity, word lines, bit lines, comparand lines, and other well-known elements of the associated CAM array are not shown in FIG. 1. In addition, various well-known clock, enable, and control signals are not shown in FIG. 1 for simplicity.

A match line pre-charge circuit 106 is coupled between a supply voltage VDD and match line ML, and includes an input to receive a pre-charge signal (PC). Prior to each compare operation between an n-bit comparand word and an n-bit CAM word stored in CAM cells 102(1)-102(n), match line ML is pre-charged to or toward a supply voltage VDD via ML pre-charge circuit 106 in response to PC. The n-bits of the comparand word are compared with corresponding bits of the CAM word in respective CAM cells 102(1)-102(n). If all bits of the comparand word match corresponding bits of the CAM word, then the match line ML remains in its charged state to indicate a match condition. Conversely, if any one of the comparand bits does not match the corresponding CAM bit, then the CAM cell 102 storing that CAM bit discharges match line ML low toward ground potential to indicate a mismatch condition.

Figures 1B, 1C:
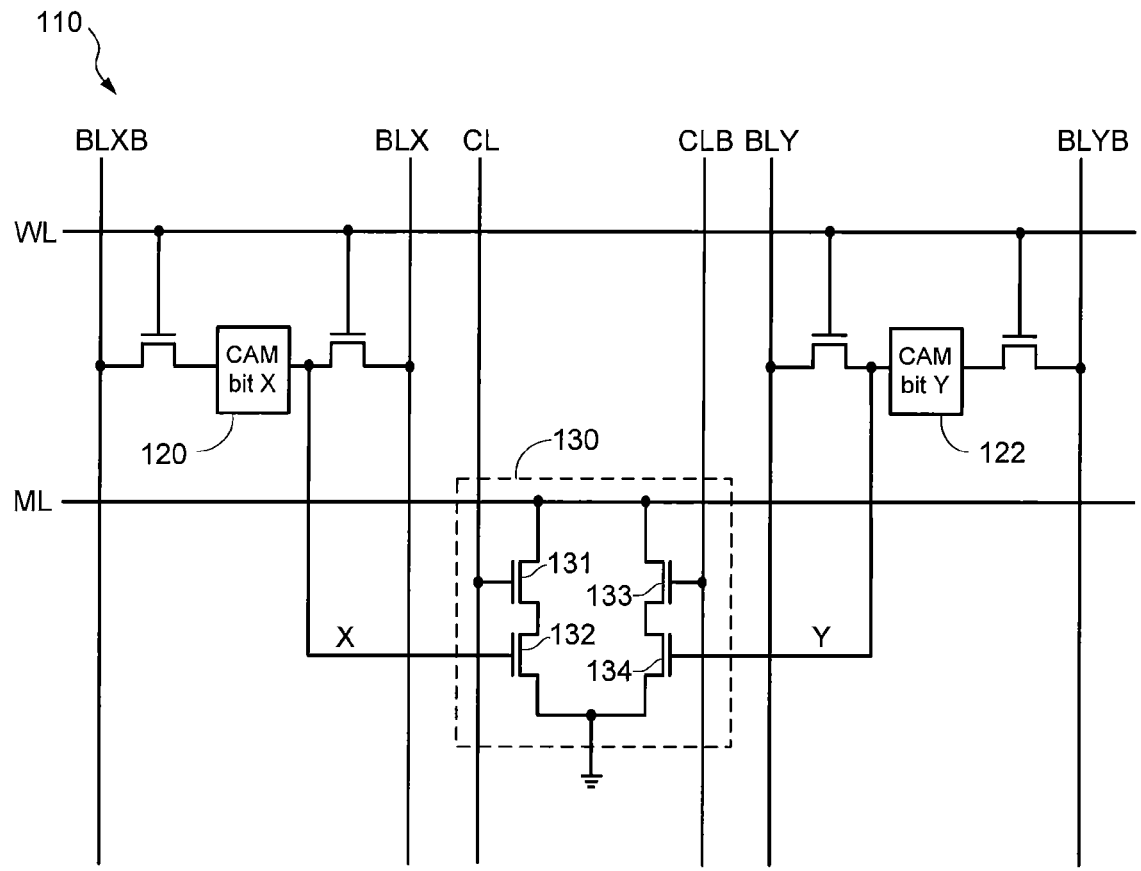
FIG. 1B is a circuit diagram of a quaternary (XY) CAM cell.
FIG. 1C shows a truth table for data storage of the XY CAM cell of FIG. 1B.

For example, FIG. 1B shows a quaternary CAM cell 110 that is an example of CAM cell 102 in row 100 of FIG. 1A. Quaternary CAM cell 110, which is also referred to as an XY CAM cell, includes two storage cells 120 and 122 coupled to a compare circuit 130. The two data bits X and Y can collectively represent four possible states: "0", "1", "don't care", and a fourth state which may be left unused or may indicate "invalid," as depicted in FIG. 1C. The logic "0" and "1" states correspond to the logic states represented, for example, by a conventional binary CAM cell. For each of these states, if the comparand data (e.g., provided to CAM cell 110 via complementary comparand lines CL and CLB) matches the data stored in CAM cell 110, compare circuit 130 does not discharge the match line ML, which indicates a match condition. Conversely, if the comparand data does not match the data stored in CAM cell 110, compare circuit 130 discharges ML (e.g., toward ground potential) to indicate the mismatch condition. For the "don't care" state, the logic low values for X and Y maintain respective transistors 132 and 134 in non-conductive states, thereby preventing compare circuit 130 from discharging ML. In this manner, data stored in CAM cell 110 is masked from the compare operation, thereby forcing a match condition for CAM cell 110, regardless of the comparand data. For the "invalid" state, the logic high values for X and Y maintain respective transistors 132 and 134 in conductive states. During a compare operation, one of the complementary comparand data bit pair provided on CL/CLB will be logic high, thereby causing compare circuit 130 to discharge ML to indicate the mismatch state, regardless of the comparand data.

Note that the XY CAM cell 110 stores a data value as a complimentary bit pair, where the Y bit stores the binary data value and the X bit stores the complemented binary data value.

The present embodiments reduce power consumption of CAM devices during compare operations between a search key and data stored in the device's array by reducing the amount of electric charge by which the match line is discharged during mismatch conditions. More specifically, for some embodiments, respective rows (e.g., each row) of the CAM array include circuitry that discharges the match line to a virtual ground node (e.g., rather than to ground potential) during mismatch conditions. Because the electrical potential on the virtual ground node is greater than ground potential, power consumption associated with pre-charging the match line back to a logic high state during the next compare operation is reduced, as compared to techniques that discharges the match line completely to ground potential.

Figure 2:
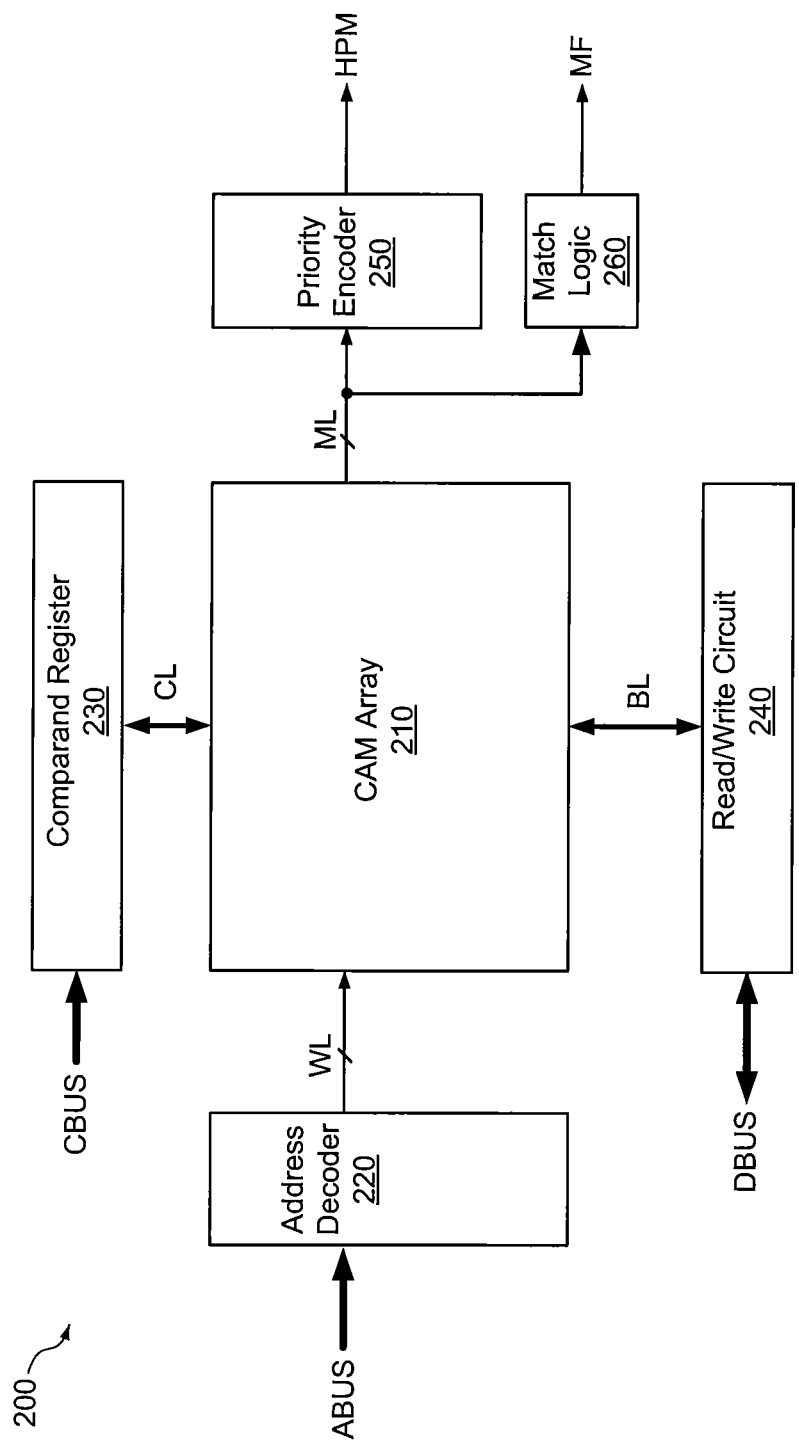
FIG. 2 is a block diagram of a CAM device within which the present embodiments may be implemented.

FIG. 2 is a block diagram of a CAM device 200 within which CAM arrays of present embodiments may be implemented. CAM device 200 includes a CAM array 210, an address decoder 220, a comparand register 230, a read/write circuit 240, a priority encoder circuit 250, and match logic 260. CAM array 210 includes any number of rows of CAM cells (not shown for simplicity in FIG. 2), where each row of CAM cells can be configured to store a data word. Further, while CAM array 210 is shown in FIG. 2 as a single CAM array, it may include any number of CAM array blocks that can be independently searched.

One or more instructions and related control signals may be provided to CAM device 200 from an instruction decoder (not shown for simplicity) to control read, write, compare, and other operations for CAM device 200. Other well-known signals that can be provided to CAM device 200, such as enable signals, clock signals, and power connections, are not shown for simplicity. Further, although not shown in FIG. 2, each row of CAM cells in CAM array 210 may have one or more validity bits to indicate whether the corresponding row (or any segment thereof) of CAM cells stores valid data.

Each row of CAM cells (not shown in FIG. 2 for simplicity) in CAM array 210 is coupled to address decoder 220 via a corresponding word line WL, and to priority encoder 250 and well-known match logic 260 via a corresponding match line ML. For simplicity, the word lines and match lines are represented collectively in FIG. 2. Address decoder 220 is well-known, and includes circuitry to select corresponding rows in CAM array 210 for read, write, and/or other operations in response to an address received from an address bus ABUS using the word lines WL. For other embodiments, addresses may be provided to address decoder 220 from another suitable bus and/or circuitry.

The match lines ML provide match results for compare operations between comparand data (e.g., a search key) and data stored in CAM array 210. Priority encoder 250, which is well-known, uses the match results indicated on the match lines to determine the matching entry that has the highest priority number associated with it and generates the index or address of this highest priority match (HPM). In addition, priority encoder 250 may use the validity bits from CAM array 210 to generate the next free address that is available in CAM array 210 for storing new data. Although not shown in FIG. 2, for some embodiments, priority encoder 250 may provide the next free address to the address decoder 220.

Match logic 260, which is well-known, uses the match results indicated on the match lines to generate a match flag (MF) indicative of a match condition in CAM array 210. If there is more than one matching entry in CAM array 210, match logic 260 may generate a multiple match flag to indicate a multiple match condition. In addition, match logic 260 may use the validity bits from CAM array 210 to assert a full flag when all of the rows of CAM cells in CAM array 210 are filled with valid entries.

Each column of CAM cells (not shown in FIG. 2 for simplicity) in CAM array 210 is coupled to comparand register 230 via one or more corresponding comparand lines CL, and is coupled to read/write circuit 240 via one or more corresponding bit lines BL. For simplicity, the comparand lines CL and bit lines BL are represented collectively in FIG. 2. Comparand register 230 is well-known, and is configured to provide a search key (e.g., a comparand word) received from a comparand bus CBUS to CAM array 210 during compare operations with data stored therein. For other embodiments, the search key can be provided to CAM array 210 via another bus and/or circuit. Read/write circuit 240 includes well-known write drivers to write data received from a data bus DBUS to CAM array 210 via the bit lines BL, and includes well-known sense amplifiers to read data from CAM array 210 onto DBUS. For other embodiments, read/write circuit 240 may be coupled to a bus other than DBUS. Further, although not shown in FIG. 2 for simplicity, CAM device 200 can include a well-known global mask circuit (e.g., coupled to the comparand register 230) that can selectively mask the bits of the search key provided to the CAM array 210.

Figure 3:
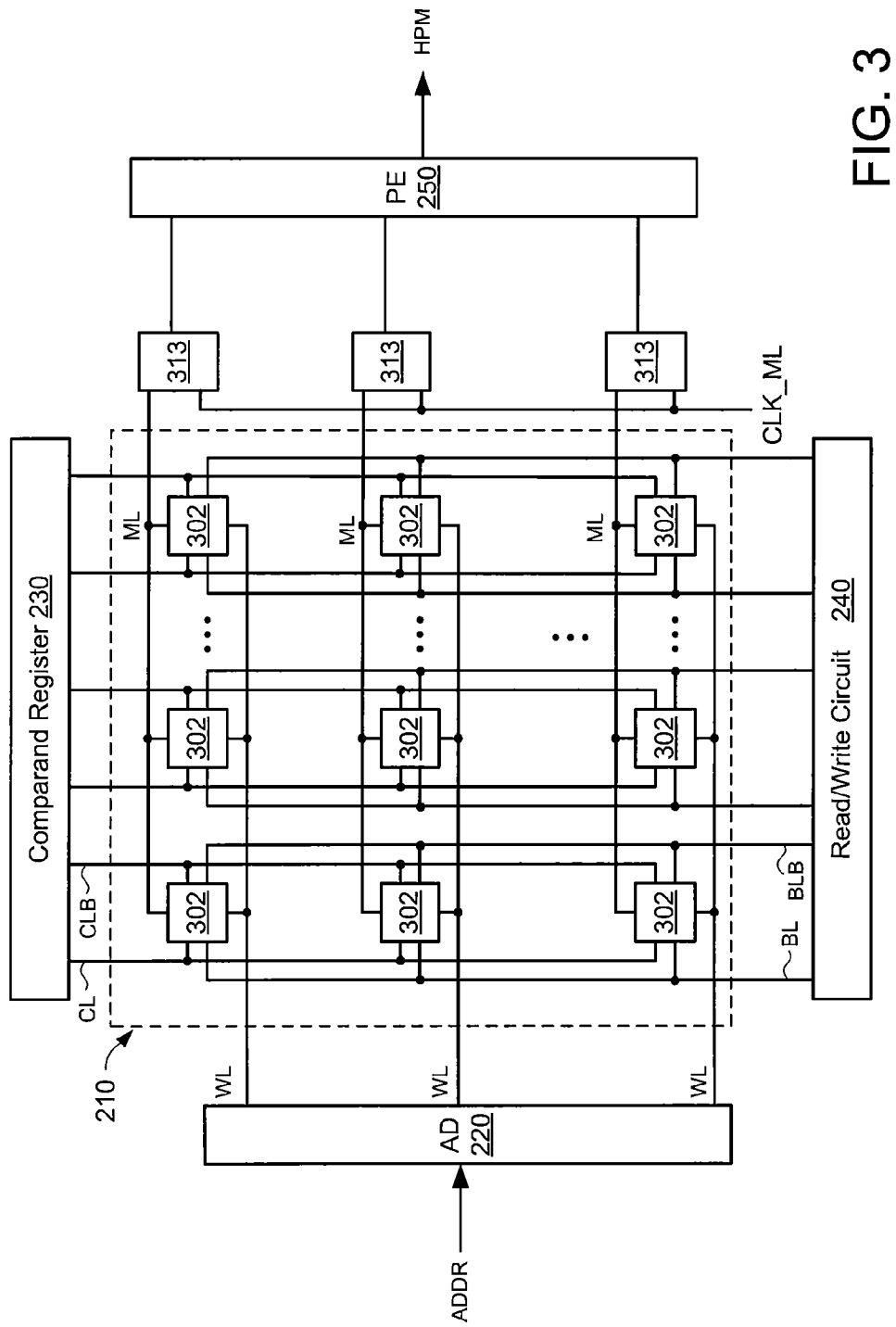
FIG. 3 is a block diagram of one embodiment of the CAM array of FIG. 2.

FIG. 3 is a more detailed block diagram of the CAM array 210 of FIG. 2. CAM array 210 is shown to include a plurality of CAM cells 302 (e.g., including cells 102(1)-102(n), FIG. 1A) organized in any number of rows and columns. The CAM cells 302 can be any suitable type of CAM cell including, for example, binary CAM cells, ternary CAM cells, and/or quaternary CAM cells (e.g., quaternary CAM cells 110, FIG. 1B). As noted above, each row of CAM array 210 may also include one or more validity bits. Each row of CAM cells 302 is coupled to a match line ML and to a word line WL. Each word line WL is driven by address decoder 220 (see also FIG. 2) to select one or more rows of CAM cells 302 for writing or reading. Each match line ML is coupled to priority encoder 250 via a corresponding match latch 313. The match latches 313 are clocked by a match latch clock signal CLK_ML in a well-known manner. Each column of CAM cells 302 in CAM array 210 is coupled to read/write circuit 240 via a complementary bit line pair BL/BLB, and to comparand register 230 via a complementary comparand line pair CL/CLB.

Prior to compare operations, the match lines ML are pre-charged (e.g., to logic high), and each set of complementary comparand line pairs CL/CLB are driven to the same predetermined logic level (e.g., to logic low, or alternatively to logic high). Then, during compare operations, the comparand register 230 provides the search key (e.g., the comparand word) to the CAM cells 302 by driving each pair of complementary comparand lines CL/CLB to opposite logic states indicative of the corresponding bit of the search key. For example, to provide a logic low comparand bit (C) to a column of CAM cells, the corresponding comparand line CL is driven to a first logic state (e.g., logic low) and the corresponding complementary comparand line CLB is driven to a second logic state (e.g., logic high); conversely, to provide a logic high comparand bit C to the column of CAM cells, the corresponding comparand line CL is driven to the second logic state (e.g., logic high) and the corresponding complementary comparand line CLB is driven to the first logic state (e.g., logic low). Thereafter, if all the CAM cells 302 in a particular row match the corresponding bits of the search key, then the match line ML remains in its pre-charged (e.g., logic high) state to indicate the match condition. Conversely, if one or more of the CAM cells 302 in the row do not match the corresponding bit of the search key, then mismatching CAM cells 302 discharge the match line (e.g., toward ground potential) to indicate the mismatch condition.

Figure 4A:
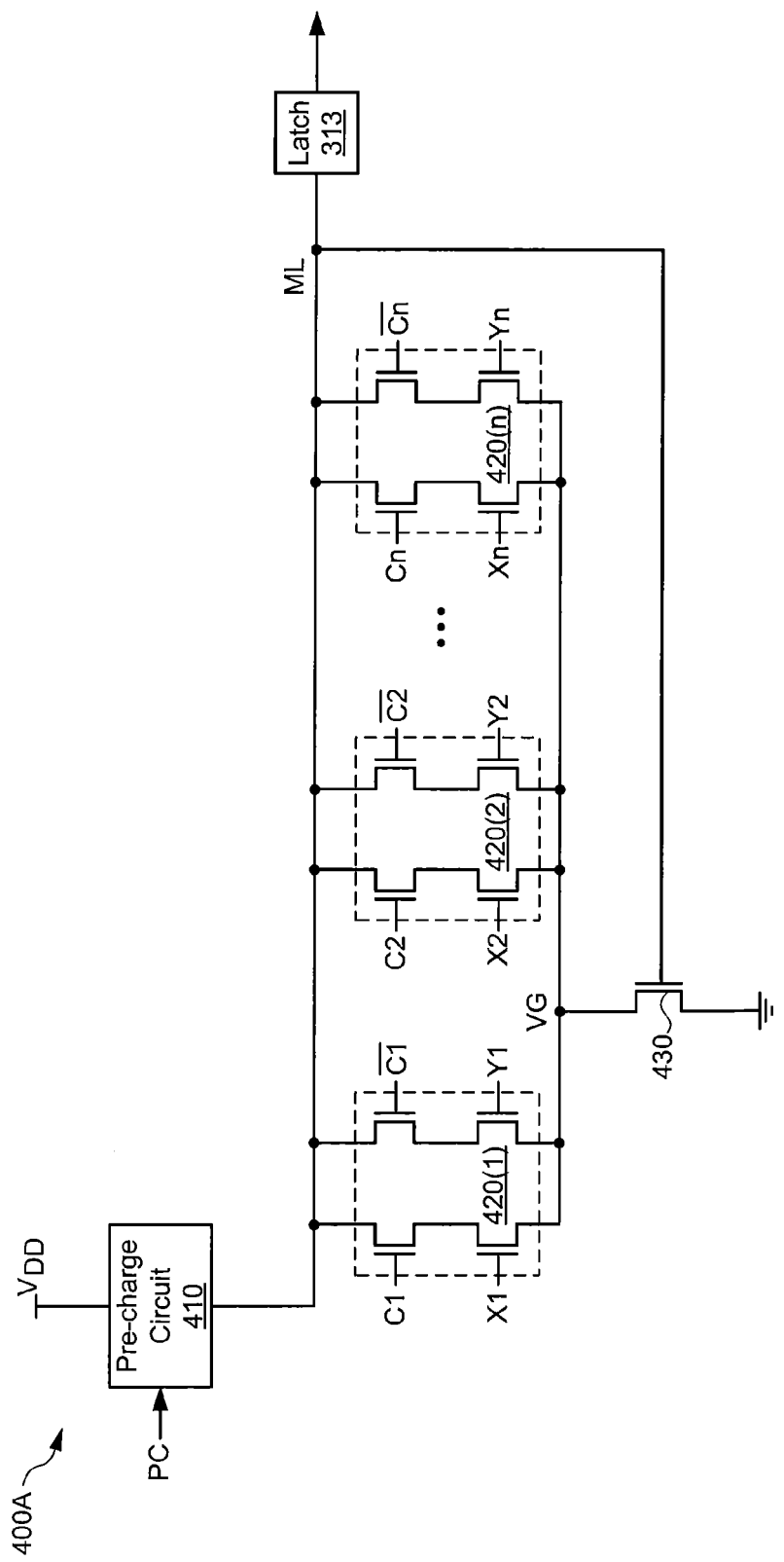
FIG. 4A is a block diagram of a row of CAM cells coupled to a match line in accordance with some embodiments.

FIG. 4A shows a CAM row 400A in accordance with some of the present embodiments. CAM row 400A, which can be deployed in CAM arrays of the type described above with respect to FIGS. 2-3, is shown to include a match line pre-charge circuit 410, a plurality of CAM cells 420(1)-420(n), an NMOS match line discharge transistor 430, and match latch 313. For simplicity, only the compare circuits of the CAM cells 420 are shown in FIG. 4A, where each compare circuit is connected between the match line ML and a virtual ground (VG) node and compares CAM data bits X and Y with the comparand bit C and its complement $\overline{C}$. Thus, referring also to FIG. 1B, for some embodiments, each CAM cell 420 is a quaternary CAM cell 110 that stores the X bit in a first data cell 120, stores the Y bit in a second data cell 122, receives the comparand bit C from the comparand line CL, and receives the complemented comparand bit $\overline{C}$ from the complemented comparand line CLB. For example, CAM cell 420(1) is configured to compare a comparand value represented by complementary comparand bits C1 and $\overline{C1}$ with a data value represented by data bits X1 and Y1 stored in the CAM cell to indicate a match condition on the match line ML. Of course, for other embodiments, CAM cells 420 can be either binary or ternary CAM cells having compare circuits connected between the match line ML and the virtual ground (VG) node.

The match line pre-charge circuit 410 is connected between a supply voltage VDD and the match line ML, and selectively pre-charges the match line ML in response to a match line pre-charge signal PC. Each of the plurality of CAM cells 420(1)-420(n) is connected between the match line ML and the VG node, and is configured to receive a corresponding complementary bit pair (C/$\overline{C}$) via corresponding comparand lines (not shown in FIG. 4A for simplicity). The match line ML is connected to an input of match latch 313, which includes an output coupled to priority encoder 250 (see also FIG. 2). The match line discharge transistor 430 is connected between the VG node and ground potential, and has a gate connected to the match line ML.

During a pre-charge phase of a compare operation, the PC signal is asserted (e.g., to logic high) so that the pre-charge circuit 410 pulls the match line ML high towards VDD. The logic high voltage on the match line ML turns on the discharge transistor 430, which in turn discharges the VG node to ground potential. Referring also to FIG. 3, the comparand lines CL/CLB are both pre-charged (e.g., to logic low, toward ground potential) during the pre-charge phase of the compare operation.

Then, during an evaluation phase of the compare operation, the comparand bits C1-Cn are provided in a complementary manner to the CAM cells 420(1)-420(n) for comparison with data bits (e.g., as represented by respective combinations of X1-Xn and Y1-Yn, as illustrated for example in FIG. 1C) stored therein. If all of the CAM cells 420(1)-420(n) store data values that match corresponding bits of the comparand word, then none of the compare circuits of the CAM cells 420(1)-420(n) turns on, and the match line ML remains in its pre-charged logic high state to indicate the match condition. Conversely, if any of the CAM cells 420(1)-420(n) store a data value that does not match the corresponding bit of the comparand word, then the compare circuit of the mismatching CAM cell(s) 420 turns on and couples the match line ML to the VG node. Because the discharge transistor 430 is conductive and connects the VG node to ground potential, the mismatching CAM cell(s) 420 and the discharge transistor 430 form a discharge path to ground potential that allows the match line ML to begin discharging to a logic low state to indicate the mismatch condition. As the voltage on the match line ML falls below the threshold voltage (VT) of the discharge transistor 430, the discharge transistor 430 turns off and de-couples the VG node from ground potential, thereby preventing the VG node (and thus the match line ML) from completely discharging to ground potential. More specifically, by turning off the discharge transistor 430 as its gate voltage (and thus the match line voltage) falls below the VT, embodiments of FIG. 4A effectively set a minimum match line voltage of approximately VT for mismatch conditions. As a result, the match line ML can be pre-charged to its logic high state (e.g., VDD) for the next compare operation using less current than CAM row architectures of the type depicted in FIG. 1A.

Although effective in preventing the match line voltage from falling below approximately VT during mismatch conditions, the virtual ground node VG has an undesirable capacitance that can reduce the power savings associated with pre-charging the match line ML toward VDD from VT instead of from ground potential. In addition, when the match line ML is pre-charged towards VDD during the pre-charge phase of the next compare operation by the pre-charge circuit 410, the resulting logic high state on the match line ML turns on the match line discharge transistor 430, which in turn discharges the VG node to ground potential.

Figure 4B:
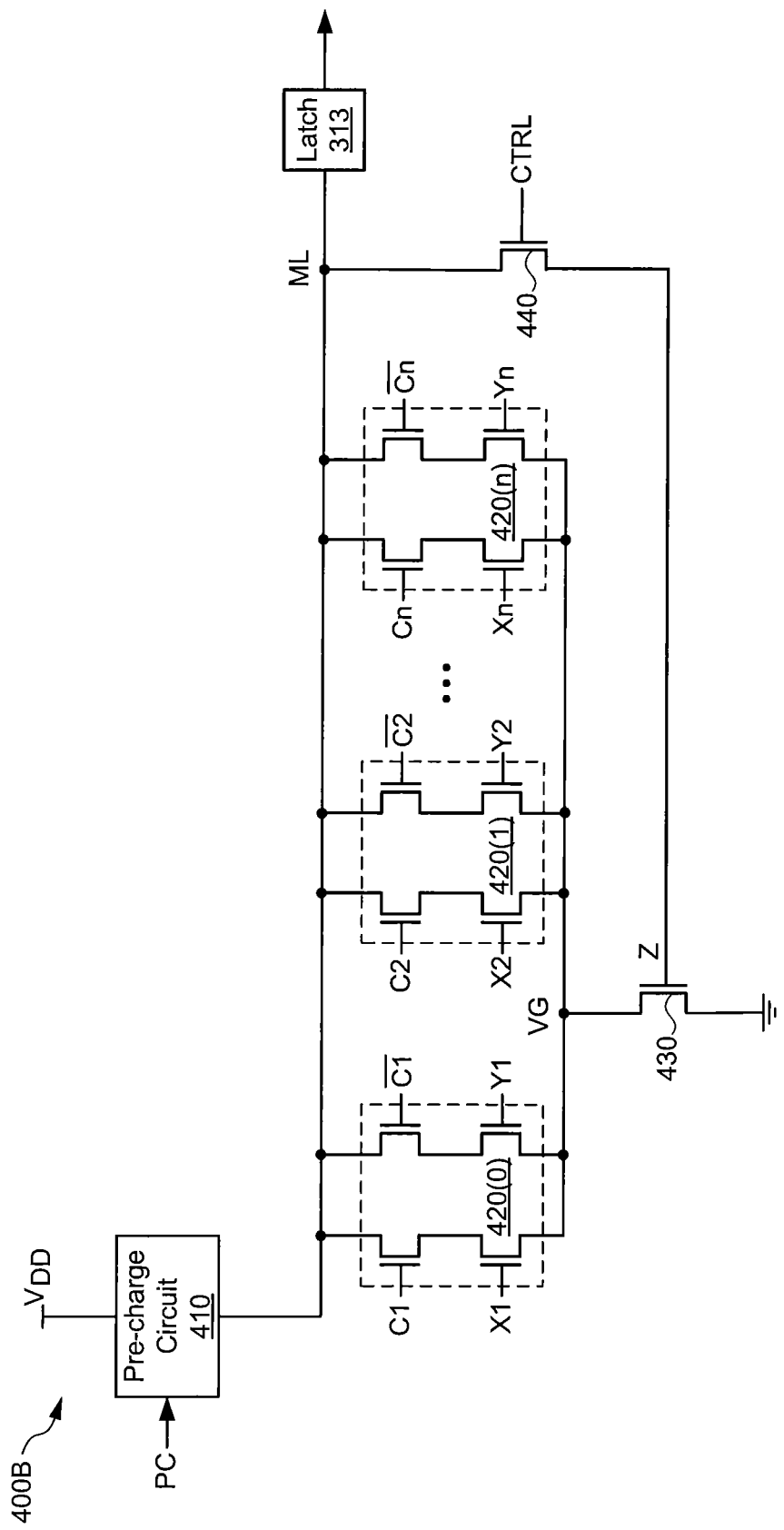
FIG. 4B is a block diagram of a row of CAM cells coupled to a match line in accordance with other embodiments.

FIG. 4B shows a CAM row 400B in accordance with other embodiments. CAM row 400B, which can be deployed in CAM arrays of the type described above with respect to FIGS. 2-3, is shown to include a match line pre-charge circuit 410, a plurality of CAM cells 420(1)-420(n), NMOS match line discharge transistor 430, an NMOS gating transistor 440, and match latch 313. For simplicity, only the compare circuits of the CAM cells 420 are shown in FIG. 4B, as described above with respect to FIG. 4A.

The match line pre-charge circuit 410 is connected between a supply voltage VDD and the match line ML, and selectively pre-charges the match line ML in response to the match line pre-charge signal PC. Each of the plurality of CAM cells 420(1)-420(n) is connected between the match line ML and the VG node, and is configured to receive a corresponding complementary bit pair (C/$\overline{C}$) via corresponding comparand lines (not shown in FIG. 4B for simplicity). The match line ML is connected to an input of match latch 313, which includes an output coupled to priority encoder 250 (see also FIG. 2). The match line discharge transistor 430 is connected between the VG node and ground potential, and has a gate (node Z) that is selectively connected to the match line ML via gating transistor 440. The gate of gating transistor 440 receives a control signal CTRL. When CTRL is asserted (e.g., to logic high), gating transistor 440 turns on and connects the gate of the discharge transistor 430 to the match line ML. Conversely, when CTRL is de-asserted (e.g., to logic low), gating transistor 440 turns off and isolates the gate of the discharge transistor 430 from the match line ML.

During a pre-charge phase of a compare operation, the PC signal is asserted (e.g., to logic high) so that the pre-charge circuit 410 pulls the match line high towards VDD, and the control signal CTRL is de-asserted to turn off gating transistor 440, thereby isolating the gate of discharge transistor 430 from the match line ML. In this manner, node Z (i.e., the gate of the discharge transistor 430) either floats or remains in the logic state resulting from the previous compare operation.

Then, during the evaluation phase of the compare operation, the comparand bits C1-Cn are provided in a complementary manner to the CAM cells 420(1)-420(n) for comparison with data bits (e.g., as represented by respective combinations of X1-Xn and Y1-Yn, as illustrated for example in FIG. 1C) stored therein, and the control signal CTRL is asserted (e.g., to logic high) to turn on the gating transistor 440. Once conductive, gating transistor 440 couples the gate of the discharge transistor 430 to the match line ML. If all of the CAM cells 420(1)-420(n) store data values that match corresponding bits of the comparand word, then none of the compare circuits of the CAM cells 420(1)-420(n) turns on, and the match line ML remains in its pre-charged logic high state to indicate the match condition.

Conversely, if there is a mismatch condition in row 400B, then the match line ML begins discharging low towards ground potential through the compare circuit of the mismatching CAM cell(s) 420 and the discharge transistor 430 to indicate the mismatch condition. As the voltage on the match line ML falls below the VT of discharge transistor 430, discharge transistor 430 turns off and de-couples the VG node from ground potential, thereby preventing the VG node (and thus the match line ML) from completely discharging to ground potential and setting a minimum match line voltage of approximately VT for mismatch conditions. The match line ML can be pre-charged to its logic high state (e.g., VDD) for the next compare operation using less current than CAM row architectures of the type depicted in FIG. 1A.

Further, by maintaining the discharge transistor 430 in a non-conductive state during the pre-charge phase, the VG node is not discharged to ground potential, which is advantageous over the CAM row 400A of FIG. 4A because of the resultant reduction in charge sharing with the match line ML. However, as mentioned above, node Z can remain floating during the pre-charge phase, which is undesirable because residual capacitive charge on node Z can inadvertently turn on discharge transistor 430 and discharge the VG node to ground potential. This problem can be solved by the embodiment of FIG. 4C.

Figure 4C:
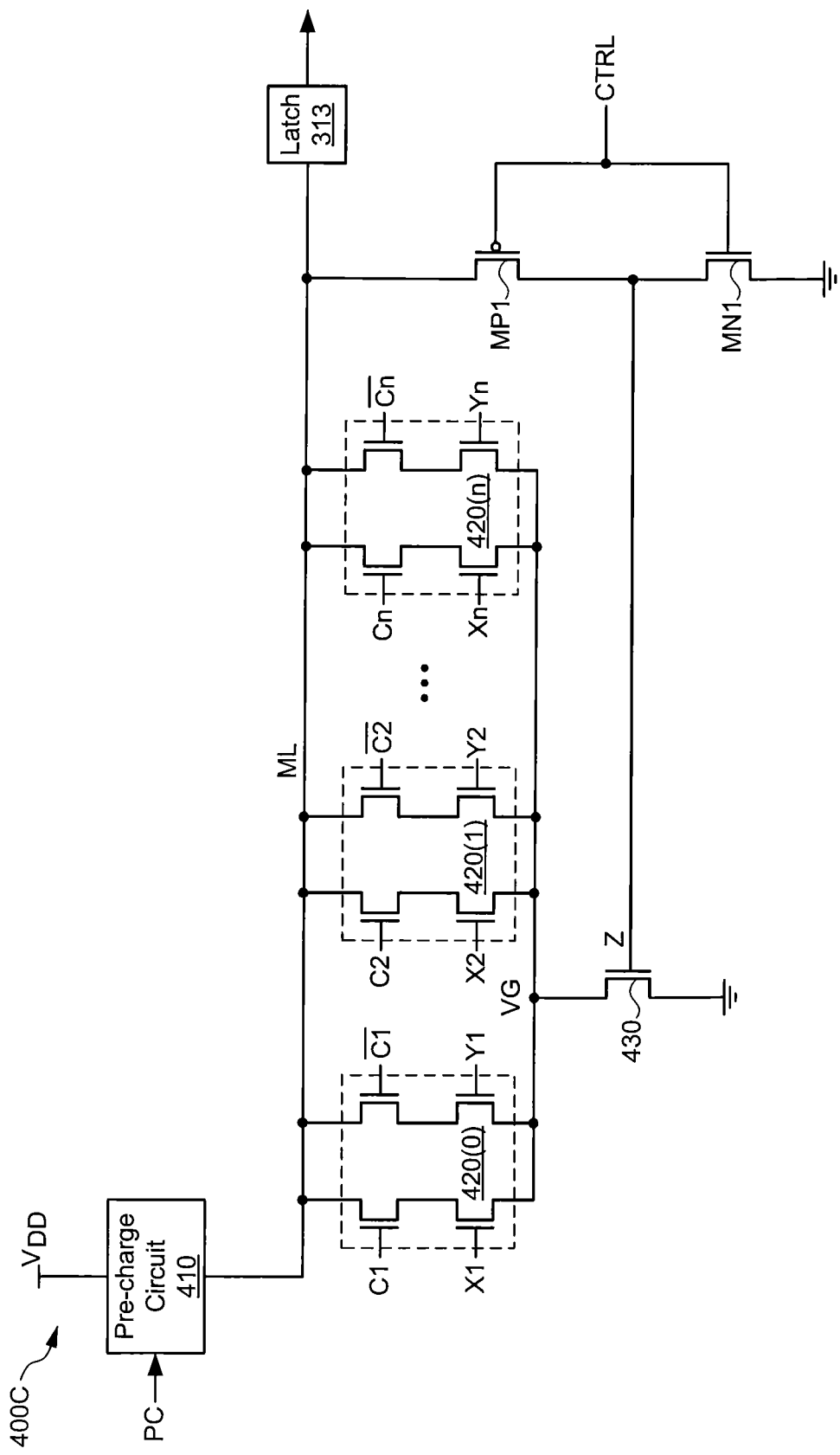
FIG. 4C is a block diagram of a row of CAM cells coupled to a match line in accordance with still other embodiments.

FIG. 4C shows a CAM row 400C in accordance with still other embodiments. CAM row 400C, which can be deployed in CAM arrays of the type described above with respect to FIGS. 2-3, is shown to include a match line pre-charge circuit 410, a plurality of CAM cells 420(1)-420(n), NMOS match line discharge transistor 430, a PMOS gating transistor MP1, an NMOS gating transistor MN1, and match latch 313. For simplicity, only the compare circuits of the CAM cells 420 are shown in FIG. 4C, as described above with respect to FIG. 4A. Further, for other embodiments, PMOS gating transistor MP1 can be replaced by an NMOS transistor, and NMOS gating transistor MN1 can be replaced by a PMOS transistor.

The match line pre-charge circuit 410 is connected between a supply voltage VDD and the match line ML, and selectively pre-charges the match line ML in response to the match line pre-charge signal PC. Each of the plurality of CAM cells 420(1)-420(n) is connected between the match line ML and the VG node, and is configured to receive a corresponding complementary bit pair (C/$\overline{C}$) via corresponding comparand lines (not shown in FIG. 4C for simplicity). The match line ML is connected to an input of match latch 313, which includes an output coupled to priority encoder 250 (see also FIG. 2). The match line discharge transistor 430 is connected between the VG node and ground potential, and has a gate (node Z) that is selectively connected to either the match line ML via gating transistor MP1 or to ground potential via gating transistor MN1.

More specifically, gating transistors MP1 and MN1 are connected in series between the match line ML and ground potential, have common drains connected to the gate of discharge transistor 430 at node Z, and have common gates to receive the control signal CTRL. When CTRL is asserted (e.g., to logic high), gating transistor MP1 turns off and isolates node Z from the match line ML, and gating transistor MN1 turns on and connects the gate of the discharge transistor 430 to ground potential. Conversely, when CTRL is de-asserted (e.g., to logic low), gating transistor MP1 turns on and connects node Z to the match line ML, and gating transistor MN1 turns off and isolates the gate of the discharge transistor 430 from ground potential. The gating transistors MP1 and MN1 form an inverter that inverts the control signal CTRL and provides the inverted control signal to the gate of discharge transistor 430 at node Z.

During a pre-charge phase of a compare operation, the PC signal is asserted (e.g., to logic high) so that the pre-charge circuit 410 pulls the match line high towards VDD, and the control signal CTRL is asserted (e.g., to logic high) to turn off gating transistor MP1 and to turn on gating transistor MN1, thereby connecting the gate of discharge transistor 430 to ground potential and isolating it from the match line ML. In this manner, node Z (i.e., the gate of the discharge transistor 430) is driven to logic low to maintain the discharge transistor 430 in a non-conductive state during the pre-charge phase of the compare operation.

Then, during the evaluation phase of the compare operation, the comparand bits C1-Cn are provided in a complementary manner to the CAM cells 420(1)-420(n) for comparison with data bits (e.g., as represented by respective combinations of X1-Xn and Y1-Yn, as illustrated for example in FIG. 1C) stored therein. Also, the control signal CTRL is de-asserted (e.g., to logic low) to turn on gating transistor MP1 and to turn off gating transistor MN1, thereby connecting the gate of discharge transistor 430 to the match line ML and isolating it from ground potential. In this manner, node Z (i.e., the gate of the discharge transistor 430) is driven by the match line ML during the evaluation phase.

If all of the CAM cells 420(1)-420(n) store data values that match corresponding bits of the comparand word, then none of the compare circuits of the CAM cells 420(1)-420(n) turns on, and the match line ML remains in its charged logic high state to indicate the match condition.

Conversely, if there is a mismatch condition in row 400C, then the match line ML begins discharging low towards ground potential through the compare circuit of the mismatching CAM cell(s) 420 and the discharge transistor 430 to indicate the mismatch condition. As the voltage on the match line ML falls below the VT of discharge transistor 430, discharge transistor 430 turns off and de-couples the VG node from ground potential, thereby preventing the VG node (and thus the match line ML) from completely discharging to ground potential and setting a minimum match line voltage of approximately VT for mismatch conditions. The match line ML can be pre-charged to its logic high state (e.g., VDD) for the next compare operation using less current than CAM row architectures of the type depicted in FIG. 1A.

Further, by connecting node Z to ground potential during the pre-charge phase and connecting node Z to the match line ML during the evaluation phase, node Z is prevented from undesirably floating.

Figure 4D:
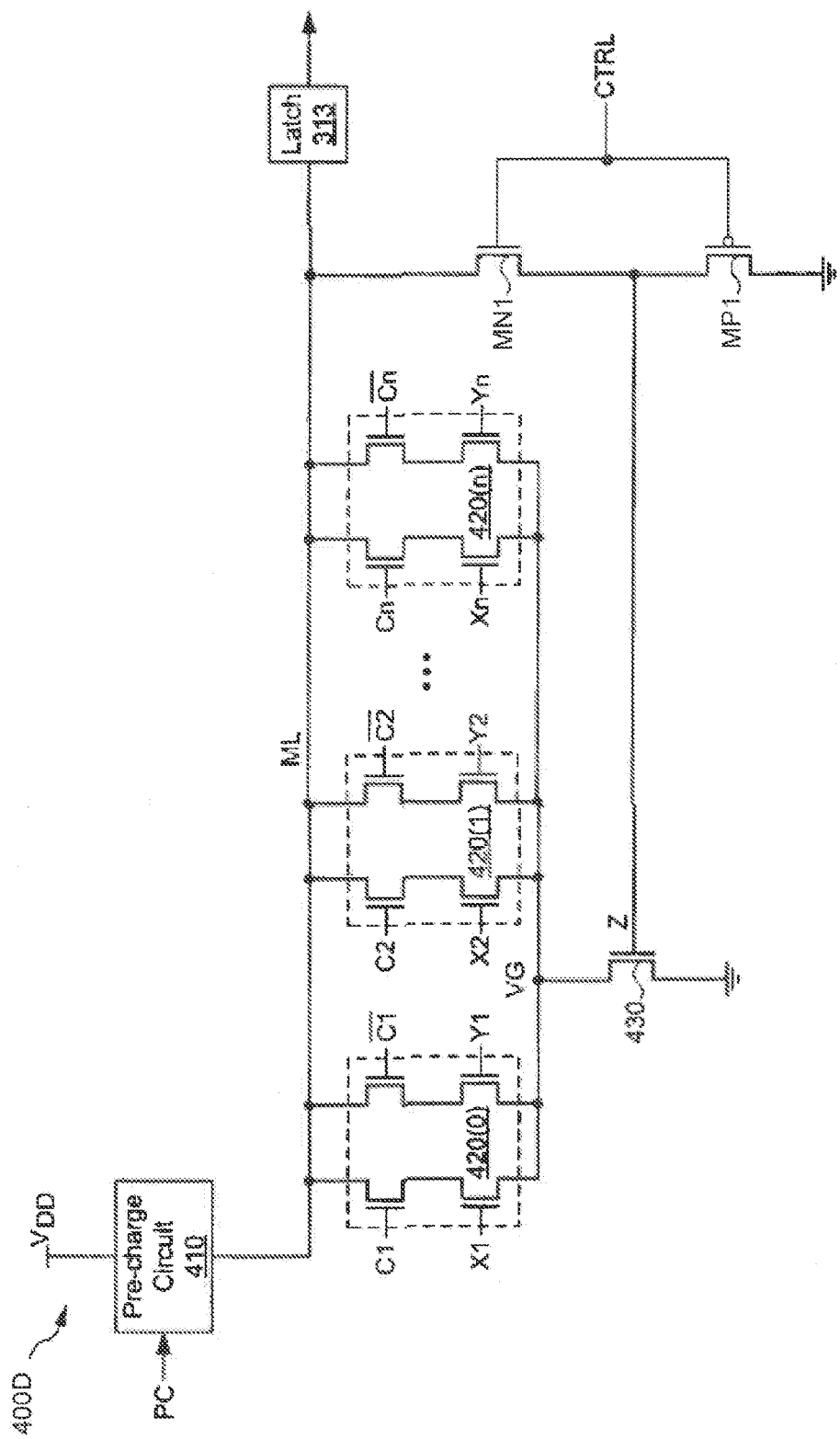
FIG. 4D is a block diagram of a row of CAM cells coupled to a match line in accordance with still other embodiments.

FIG. 4D shows a CAM row 400D in accordance with still other embodiments. The CAM row 400D includes a match line pre-charge circuit 410, a plurality of CAM cells 420(1)-420(n), NMOS match line discharge transistor 430, a PMOS gating transistor MP1, an NMOS gating transistor MN1, and match latch 313. For simplicity, only the compare circuits of the CAM cells 420 are shown in FIG. 4D, as described above with respect to FIG. 4A. The CAM row 400D is similar to the CAM row 400C of FIG. 4C, and includes gating transistors MN1 and MP1 connected in series between the match line ML and ground potential, The gating transistors MN1 and MP1 have common drains connected to the gate of discharge transistor 430 at node Z, and have common gates to receive the control signal CTRL. That is, the CAM row 400D replaces the PMOS gating transistor MP1 and NMOS gating transistor MN1 of the CAM row 400C of FIG. 4C with NMOS gating transistor MN1 and PMOS gating transistor MP1, respectively.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A content addressable memory (CAM) device comprising an array having a plurality of rows, wherein a respective row comprises:
   a plurality of CAM cells, each connected between a match line and a node;
   a match line discharge transistor connected between the node and ground potential, and having a gate;
   a first gating transistor connected between the match line and the gate of the match line discharge transistor, and having a gate to receive a control signal; and
   a second gating transistor connected between the gate of the match line discharge
   transistor and ground potential, and having a gate to receive the control signal.

2. The CAM device of claim 1, wherein the match line discharge transistor is configured. to turn off and prevent the match line from discharging below a threshold voltage of the match line discharge transistor during a mismatch condition between a search key and data stored in the respective row.

3. The CAM device of claim 1, wherein the control signal is to be asserted to maintain the first gating transistor in a non-conductive state and to maintain the second gating transistor in a conductive state during a pre-charge phase of a compare operation, and the control signal is to he de-asserted to maintain the first gating transistor in a conductive state and to maintain the second gating transistor in a 11(non-conductive state during an evaluation phase of the compare operation.

4. The CAM device of claim 1, wherein the first gating transistor is a PMOS transistor, and the second gating transistor is an NMOS transistor.

5. The CAM device of claim 1, wherein the first gating transistor is an NMOS transistor, and the second gating transistor is a PMOS transistor.

6. The CAM device of claim 1, wherein each CAM cell comprises:
   first and second data cells to store first and second data bits, respectively; and
   a compare circuit coupled to the data cells and to the match line, the compare circuit comprising:
      first and second pull-down transistors connected in series between the match line and the node, wherein the first pull-down transistor has a. gate to receive a comparand bit, and the second pull-down transistor has a gate to receive the first data bit; and
      third and fourth pull-down transistors connected in series between the match line and the node, wherein the third pull-down transistor has a gate to receive a complemented comparand bit, and the fourth pull-down transistor has a gate to receive the second data bit.

7. A content addressable memory (CAM) device comprising an array having a plurality of rows, wherein a respective row comprises:
   a plurality of CAM cells, each connected between a match line and a node;
   a match line discharge transistor connected between the node and ground potential, and having a gate; and
   a gating transistor connected between the match line and the gate of the match line discharge transistor, and having a gate to receive a control signal.

8. The CAM device of claim 7, wherein the match line discharge transistor is configured to discharge the match line only until a match line voltage reaches a threshold voltage of the match line discharge transistor when a compare operation between a search key and data stored in the respective row results in a mismatch condition.

9. The CAM device of claim 7, wherein the control signal is to be de-asserted to maintain the gating transistor in a non-conductive state during a pre-charge phase of a compare operation, and the control signal is to be asserted to maintain the gating transistor in a conductive state during an evaluation phase of the compare operation.

10. A content addressable memory (CAM) device comprising an array having a plurality of rows, wherein a respective row comprises:

a number of CAM cells, each comprising:
- first and second data cells to store first and second data bits, respectively; and
- a compare circuit coupled to the data cells and to a match line, the compare circuit comprising:
  - first and second pull-down transistors connected in series between the match line and a node, wherein the first pull-down transistor has a gate to receive a comparand bit, and the second pull-down transistor has a gate to receive the first data bit; and
  - third and fourth pull-down transistors connected in series between the match line and the node, wherein the third pull-down transistor has a gate to receive a complemented comparand bit, and the fourth pull-down transistor has a gate to receive the second data bit; and
- a match line discharge transistor connected between the node and ground potential, and having a gate;
- a first gating transistor connected between the match line and the gate of the match line discharge transistor, and having a gate to receive a control signal; and
- a second gating transistor connected between the gate of the match line discharge transistor and ground potential, and having a gate to receive the control signal.

11. The CAM device of claim 10, wherein the match line discharge transistor is configured to turn off and prevent the match line from discharging below a threshold voltage of the match line discharge transistor during a mismatch condition between the comparand bit and data stored in the CAM cell.

12. The CAM device of claim 7, wherein each CAM cell comprises:
- first and second data cells to store first and second data bits, respectively;
- a compare circuit coupled to the data cells and to the match line, the compare circuit comprising:
  - first and second pull-down transistors connected in series between the match line and the node, wherein the first pull-down transistor has a gate to receive a comparand bit, and the second pull-down transistor has a gate to receive the first data bit; and
  - third and fourth pull-down transistors connected in series between the match line and the node, wherein the third pull-down transistor has a gate to receive a complemented comparand bit, and the fourth pull-down transistor has a gate to receive the second data bit.

13. The CAM device of claim 10, wherein the Control signal is to be asserted to maintain the first gating transistor in a non-conductive state and to maintain the second gating transistor in a conductive state during a pre-charge phase of a compare operation, and the control signal is to be de-asserted to maintain the first gating transistor in a conductive state and to maintain the second gating transistor in a non-conductive state during an evaluation phase of the compare operation.

14. The CAM device of claim 10, wherein the first gating transistor is a PMOS transistor, and the second gating transistor is an NMOS transistor.

15. The CAM device of claim 10, wherein the first gating transistor is an NMOS transistor, and the second gating transistor is a PMOS transistor.

16. A content addressable memory (CAM) device comprising an array having a plurality of rows, wherein a respective row comprises:
- a plurality of CAM cells, each connected between a match line and a node; and
- a match line discharge transistor connected between the node and ground potential, and having a gate directly connected to the match line.

17. The CAM device of claim 16, wherein each CAM cell comprises:
- first and second data cells to store first and second data bits, respectively; and
- a compare circuit coupled to the data cells and to the match line, the compare circuit comprising:
  - first and second pull-down transistors connected in series between the match line and the node, wherein the first pull-down transistor has a gate to receive a comparand bit, and the second pull-down transistor has a gate to receive the first data bit; and
  - third and fourth pull-down transistors connected in series between the match line and the node, wherein the third pull-down transistor has a gate to receive a complemented comparand bit, and the fourth pull-down transistor has a gate to receive the second data bit.

18. The CAM device of claim 12, wherein the control signal is to be de-asserted to maintain the gating transistor in a non-conductive state during a pre-charge phase of a compare operation, and the control signal is to be asserted to maintain the gating transistor in a conductive state during an evaluation phase of the compare operation.

* * * * *

UNITED STATES PATENT AND TRADEMARK OFFICE
CERTIFICATE OF CORRECTION

PATENT NO. : 8,773,880 B2  Page 1 of 1
APPLICATION NO. : 13/167646
DATED : July 8, 2014
INVENTOR(S) : Dimitri Argyres It is certified that error appears in the above-identified patent and that said Letters Patent is hereby corrected as shown below:

In the Claims

Column 10, line 14, Claim 3, replace "is to he de-asserted" with --is to be de-asserted--.

Column 10, lines 16-17, Claim 3, replace "in a 11(non-conductive state" with --in a non-conductive state--.

Signed and Sealed this
Seventh Day of October, 2014

Michelle K. Lee
*Deputy Director of the United States Patent and Trademark Office*